United States Patent [19]
Buckley

[11] Patent Number: 4,831,640
[45] Date of Patent: May 16, 1989

[54] ILLUMINATION SYSTEM FOR X-RAY LITHOGRAPHY

[75] Inventor: W. Derek Buckley, Easton, Conn.

[73] Assignee: The Perkin-Elmer Corporation, Norwalk, Conn.

[21] Appl. No.: 65,135

[22] Filed: Jun. 19, 1987

Related U.S. Application Data

[63] Continuation of Ser. No. 862,933, May 14, 1986, abandoned, which is a continuation of Ser. No. 622,893, Jun. 21, 1984, abandoned.

[51] Int. Cl.$^4$ .............................................. G21K 3/00
[52] U.S. Cl. ...................................... 378/34; 378/156; 378/159; 250/503.1
[58] Field of Search ................... 378/34, 35, 156, 157, 378/158, 159; 250/4003.1, 503.1

[56] References Cited

U.S. PATENT DOCUMENTS 4,006,361  2/1977  Schriber ............................. 378/159
4,288,695  9/1981  Walters et al. ..................... 378/159

FOREIGN PATENT DOCUMENTS 104438  8/1981  Japan .................................... 378/34

Primary Examiner—Carolyn E. Fields
Assistant Examiner—David P. Porta
Attorney, Agent, or Firm—Paul A. Fattibene; Thomas P. Murphy; Edwin T. Grimes

[57] ABSTRACT

This invention is directed to an improvement in an x-ray lithography system having an x-ray point source of radiation, a wafer disposed in spaced relationship with respect to the source, and a mask disposed between the source and the wafer whereby radiation from the source passes through the mask to the wafer, said improvement comprising the provision of an x-ray absorbent element mounted between the source and the wafer, said element having a radial absorption gradient profile to compensate for radial flux variation of the x-rays.

10 Claims, 3 Drawing Sheets

4,831,640

ILLUMINATION SYSTEM FOR X-RAY LITHOGRAPHY

This application is a continuation of application Ser. No. 862,933, filed May 14, 1986, now abandoned, which is a continuation of application Ser. No. 622,893, filed June 21, 1984, now abandoned.

FIELD OF INVENTION

This invention relates to x-ray lithography and, more particularly, to an improved illumination system.

BACKGROUND OF THE INVENTION

With the need for better resolution in the lithography used in the manufacture of microcircuits, new processes have been investigated. X-ray lithography, which permits shorter wavelengths to be used, has been proposed as a solution to the resolution problem.

In an x-ray lithography exposure system, the wafer is illuminated by a point source. The flux intensity at the wafer plane varies because of the inverse square law. Because points on the wafer edge are further from the source than points at the center, the flux decreases radially. Flux nonuniformities cause linewidth variations.

Accordingly, it is an object of the present invention to substantially reduce flux variations and the resultant linewidth variations caused by this effect, as will become apparent as the description proceeds.

SUMMARY OF THE INVENTION

In order to accomplish the foregoing and other objects in an x-ray lithography system having an x-ray point source of radiation, a wafer disposed in spaced relationship with respect to said source, and a mask disposed between said source and said wafer whereby radiation from said source passes through said mask to said wafer, this invention provides an improvement comprising the provision of x-ray absorbent means mounted between said source and said wafer, said absorbent means being constructed and arranged to have a radial absorption gradient profile to compensate for the radial flux variation of the x-rays. In one form of the invention the x-ray absorbent means is in the form of a film deposited on the mask, while in another form of the invention the x-ray absorbent means comprises a film deposited on a substrate of the mask. In still another form of the invention the x-ray source includes a vacuum window and the x-ray absorbent means comprises a film deposited on said window. In yet another form the x-ray absorbent means comprises a pellicle mounted between the source and the wafer.

According to an aspect of the invention, the x-ray absorbent means comprises a film formed by vacuum evaporation, while according to another aspect thereof the x-ray absorbent means comprises a film forming by spinning a polymer material.

There has thus been outlined rather broadly the more important features of the invention in order that the detailed description thereof that follows may be better understood, and in order that the present contribution to the art may be better appreciated. There are, of course, additional features of the invention which will be described more fully hereinafter. Those skilled in the art will appreciate that the conception on which this description is based may readily be utilized as the basis for the designing of other systems for carrying out the several purposes of the invention. It is important, therefore, that this disclosure be regarded as including such equivalent systems as do not depart from the spirit and scope of the invention.

Several embodiments of the invention have been chosen for purposes of illustration and description, and are shown in the accompanying drawings, forming a part of the specification.

DETAILED DESCRIPTION OF THE PRESENTLY PREFERRED EMBODIMENTS

Figure 1:
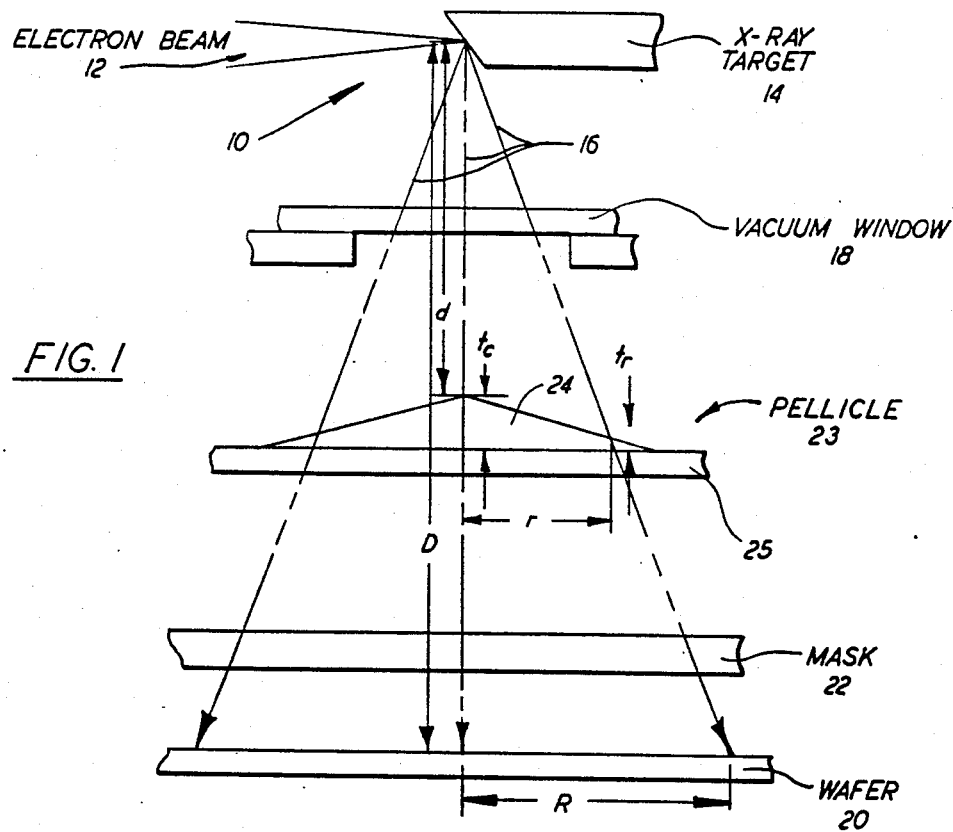
FIG. 1 is a schematic elevational view of an x-ray lithography apparatus incorporating a pellicle fabricated with a radial absorption gradient, according to the invention.

In the embodiment of the invention illustrated in FIG. 1, an x-ray lithography system is shown having an x-ray point source of radiation, indicated generally at 10, which is comprised of an electron beam 12 and an x-ray target 14 that forms a beam of radiation 16. The beam of radiation passes through a vacuum window 18, which conventionally is fabricated from berylium. A wafer 20 is mounted in spaced relationship with respect to the source 10. A mask 22 is mounted between the source 10 and the wafer 20, whereby radiation 16 from the source passes through the mask to the wafer.

X-ray absorbent means are mounted between the source 10 and the wafer 20, which are constructed and arranged to have a radial absorption gradient profile to compensate for the radial flux variation of the x-rays. In the embodiment of FIG. 1 the x-ray absorbent means is in the form of a pellicle indicated at 23. In the illustrated embodiment the pellicle comprises a film 24 disposed on a substrate 25. The substrate is fabricated of low absorption material. The film has a radial absorption gradient profile. The construction and arrangement of this pellicle will be discussed more fully hereinafter.

Figure 2:
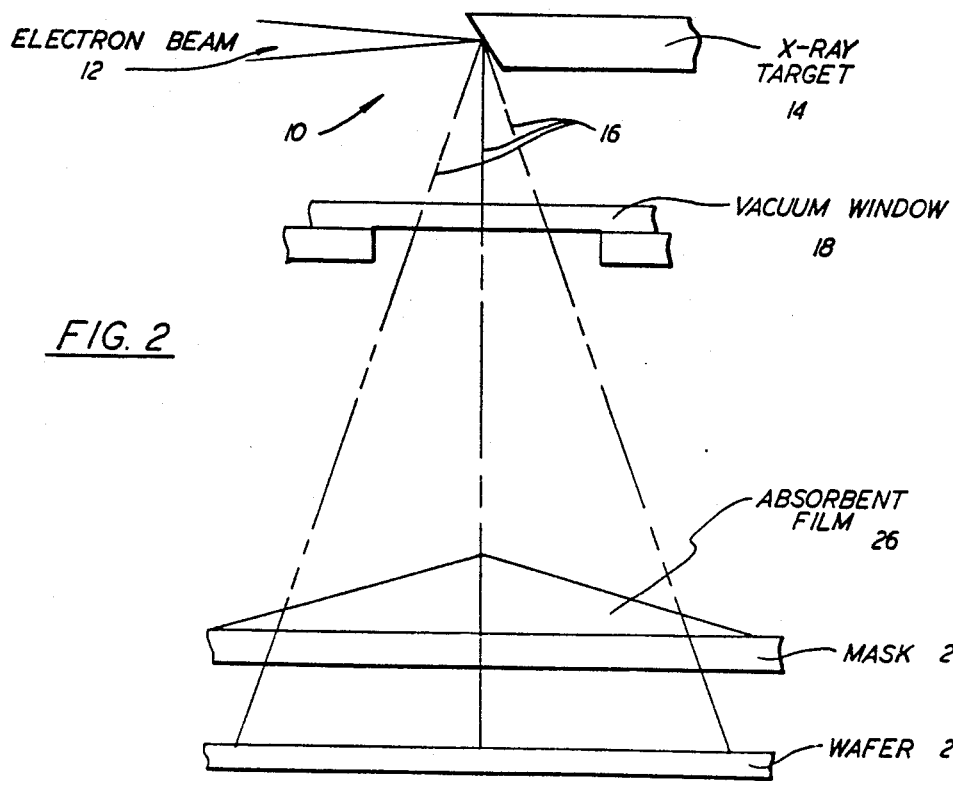
FIG. 2 is a schematic elevational view similar to FIG. 1, but showing a second embodiment of the invention.

In the embodiment of FIG. 2, there is provided an x-ray lithography system similar to the one shown in FIG. 1. However, in this system the x-ray absorbent means mounted between the source 10 and the wafer 20, which are constructed and arranged to have a radial absorption gradient profile to compensate for the radial flux variation of the x-rays, are in the form of an absorbent film 26 deposited on the mask 22. In the case of x-ray mask substrates formed by evaporation, such as titanium for example, it is possible to arrange for the gradient in the deposited substrate film, i.e. variation in thickness, to compensate for the flux variation. In general, this is not the presently preferred embodiment because it may compromise mask stability and is less flexible in terms of location. The construction and arrangements of these films will be discussed more fully hereinafter.

Figure 3:
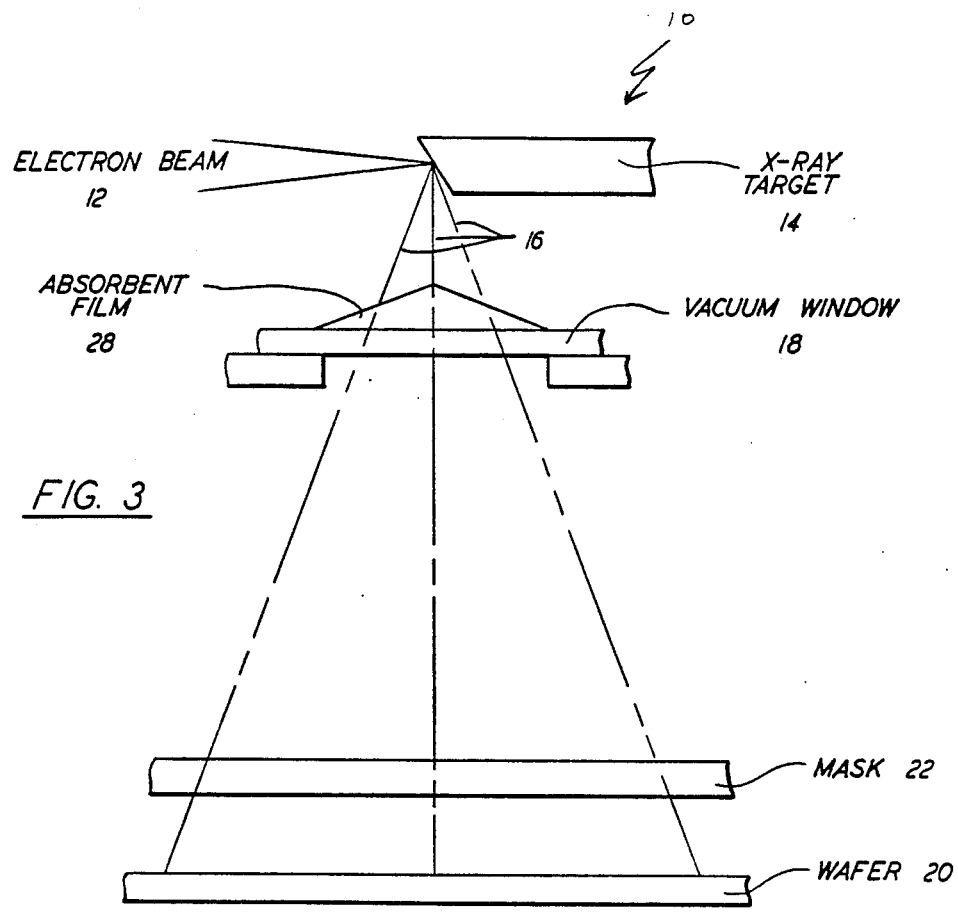

In the embodiment of FIG. 3, there is provided an x-ray lithography system similar to the ones shown in FIGS. 1 and 2. However, in this system the x-ray absorbent means mounted between the source 10 and the wafer 20, which are constructed and arranged to have a radial absorption gradient profile to compensate for the radial flux variation of the x-rays, are in the form of an absorbent film 28 deposited on the vacuum window 18. The construction and arrangements of this film will be discussed more fully hereinafter. The desired flux variation could also be achieved by radial variation in the vacuum window thickness. This could be achieved by polishing. This approach eliminates optical interference problems.

Figure 4:
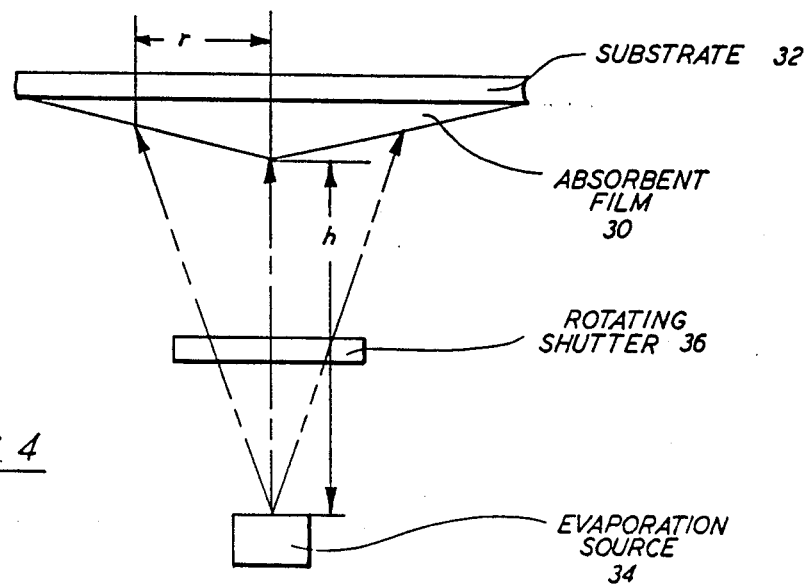
FIG. 4 is a schematic elevational view of pellicle fabrication by evaporation apparatus.
Figure 5:
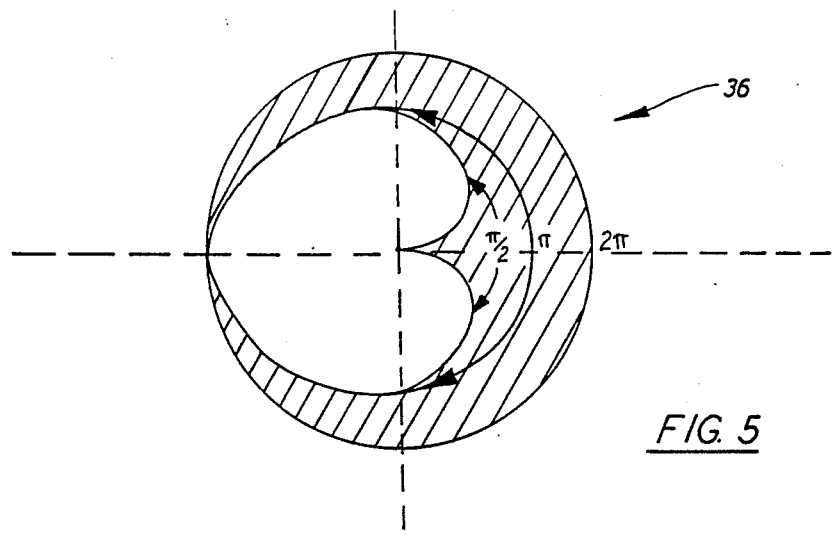
FIG. 5 is a plan view of a shaped rotating shutter used in the fabrication system of FIG. 4.

FIG. 4 illustrates a fabrication technique for forming the gradient x-ray absorbent means using vacuum evaporation of a thin film 30 onto a substrate 32. An evaporation source is indicated at 34 and a rotating shutter mounted between the source 34 and substrate 32 is indicated at 36. FIG. 5 shows a plan view of the shutter 36. The absorbent film 30 and its substrate 32 may be in the form of a pellicle 23 as seen in FIG. 1, or a film 26 deposited on a mask 22 as seen in FIG. 2, or a film 28 deposited on a vacuum window 18 as seen in FIG. 3. Additional details of this fabrication system will be discussed hereinafter.

Figure 6:
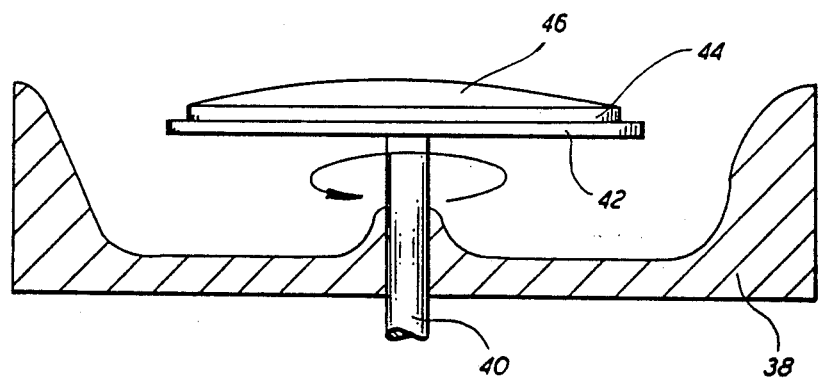
FIG. 6 is a medial, vertical sectional of a spinning apparatus for fabricating a pellicle having a radial thickness gradient.

FIG. 6 illustrates a fabrication technique for forming the x-ray gradient absorbing means, using a spin casting system. This systems comprises a main frame 38 on which a shaft 40 is rotatably mounted. A spin table 42 is mounted at the upper end of the shaft for carrying a substrate 44 on which a gradient absorbent film 46 is formed. The absorbent film 46 and its substrate 44 may be in the form of a pellicle 23 as seen in FIG. 1, or a film 26 deposited on a mask 22 as seen in FIG. 2, or a film 28 deposited on a vacuum window 18 as seen in FIG. 3. Additional details of the fabrication system will be discussed hereinafter.

X-ray Illumination Variation:

For a point x-ray source, the flux $I_R$ at a radial point R, FIG. 1, from the center of a wafer a distance D from the source is given by:

$$I_R = I_c(1 + R^2/D^2) \tag{1}$$

where $I_c$ is the flux at the wafer center (R=0)

For a typical system geometry D=20 cm. for a 100 mm. diameter wafer. This results in a 6% flux decrease from center to edge of the wafer.

[i.e., $R/D = \frac{1}{4}$, $(1+R^2/D^2)^{-1} = 0.94$]

This flux variation can be corrected by an absorber of appropriate radial signature.

X-ray Transmission:

In general for a thin film of thickness 't' and absorption 'a' the x-ray transmission is given by $$T = T_o \exp(-at)$$

where $T - T_o = 100$ percent when the product at=o, i.e. a or t equals zero.

If the absorber thickness is $t_c$ and $t_r$, FIG. 1, at the center radius r respectively then the center transmission ($T_c$) is related to the transmission ($T_r$) at radius r by:

$$T_r = T_c \exp + a(t_c - t_r)$$

and if $t_c - t_r$ is small $$T_r = T_c[1 - a(t_c - t_r)] \tag{2}$$

Equations (1) and (2) indicate that the radial flux and transmission variations due to the source and absorber respectively are opposite in sign if the absorber thickness decreases radially. In order to eliminate flux variations it is necessary to make the variations equal in magnitude and radial signature, i.e.:

$$I_r T_r = I_c T_c \tag{3}$$

Also, equation (2) indicates that the transmission variations are linear in absorber thickness. Therefore an appropriate radial thickness signature can compensate for the flux variations.

Pellicle Fabrication by Evaporation:

One method of fabricating the appropriate thickness signature is by evaporation, as illustrated in FIG. 4. Evaporation from a small area source at a distance 'h' from a substrate results in a radial (r) thickness distribution (t) described by:

$$t_r = t_c[1 + (r/h)^2]^{-2} \tag{4}$$

where $t_c$, $t_r$ are the film thickness at the center and radius r respectively. If r/h is small equation (4) can be approximated by:

$$t_c - t_r = 2d_c(r/h)^2 \tag{5}$$

Radial Flux Uniformity:

In order to ensure uniform flux, equation (3) must be satisfied. From equation (1) and (2) this requires:

$$1 + a(t_c - t_r) \simeq 1 + R^2/D^2$$

or $$a(t_c - t_r) = R^2/D^2 \tag{6}$$

However, it is necessary to use the value of $(t_c - t_r)$ at a radius on the pellicle which corresponds to a radius R on the wafer. This radial position is determined by the location of the pellicle in the exposure system. For a pellicle distance d from the exposure source $$r = Rd/D \tag{7}$$

Hence from equations (5), (6) and (7)

$$2at_c = (h/d)^2 \tag{8}$$

Equation (6) indicates the center to edge thickness change required to compensate for flux variations and the quadratic signature that is required. Equation (8) indicates the center thickness required to produce the required radial thickness signature for the evaporation geometry chosen.

EXAMPLES

Thickness Change:

From equation (6) the center to edge thickness changes required have been calculated for a Au and Titanium absorber. Assuming R=5 cm. and D=20 cm. then:

For Au $t_c - t_R \sim 0.018$ μm

For Ti $t_c - t_R \sim 0.091$ μm

Center Thickness:

If the absorber is deposited on a substrate at the same distance from the evaporation source as the wafer is from the exposure source, and if the pellicle is located near to the wafer plane, then:

$$h = D = d$$

and equation (8) becomes $$at_c \sim 0.5 \quad (9)$$

Independent of the absorber material, equations (8) and (9) indicate that the absorber will result in 61% transmission at the center. Consequently, a 64% increase in exposure time will result.

Absorber Fabrication:

For a titanium absorber $t_c \sim 0.72$ μm. In this case the absorber may be deposited on the mask membrane. Alternatively, the compensation is accomplished by the normal variation in thickness of an evaporated Ti membrane of thickness 0.72 μm.

For a Au absorber $t_c \sim 0.15$ μm

In general, it will not be convenient to deposit the material on the x-ray mask. The x-ray mask substrate supports a pattern, generally gold, which is replicated onto a wafer. It is essential that the pattern be dimensionally stable if distortion free imaging and good overlay is to be achieved. In the case of the pellicle, these requirements are removed and it is only necessary to maintain the correct location of the desired radial gradient. Thus, from a practical viewpoint, the membrane has "no stability requirements".

In the cases where a deposited, optically opaque film is used, i.e. most cases, the absorbing film will obscure the alignment system unless it is placed out of the optical path. This is another reason why the positional flexibility offered by a separate pellicle, or deposition on the window, or window thickness variation is preferred. However, a pellicle located at the wafer plane will impede alignment. It is more practical to locate the apodised pellicle nearer to the x-ray source. This can be accomplished by locating the pellicle nearer to the source during evaporation. During exposure the pellicle may be located at the same distance from the exposure source as it was from the evaporation source. This arrangement maintains h=d and r/h=R/D. Therefore, all of the previous conclusions still apply. This technique permits any arbitrary pellicle location and facilitates alignment.

Alternatively, the pellicle may be located at one distance during evaporation and at a different distance during exposure. In this case equation (8) illustrates that the center film thickness can be reduced and the exposure time penalty reduced.

For example if $h \sim d/2$ then equation (8) becomes $$at_c \sim 0.13$$

Consequently, the center transmission is increased to 88% and the exposure time penalty is reduced to 14%.

Alternative Evaporation Methods:

Equation (6) indicates that what is required is a quadratic radial film thickness variation with a maximum center to edge thickness change of less than 0.02 μm for Au or 0.09 μm for Ti. In each case this corresponds to 6% differential absorption. A film varying from a zero thickness at the periphery to 0.02 μm at the center would be acceptable in the case of Au. However, in the simple evaporation case a thicker film is required to achieve the required differential.

The exposure time penalty that results can be eliminated by means of a shaped rotating shutter, as illustrated in FIG. 5. This shutter is rotated concentrically between the source and pellicle during evaporation, as illustrated in FIG. 4. As indicated above, a 6 percent differential absorbtion is required from center to edge, which results in 100 percent transmission at the center and 94 percent at the edge. This is achieved with a film that varies from a finite value, $t_c$, at the center to zero at the edge. The rotating shutter achieves the thickness gradient by obscuring deposition during part of each cycle. The rotation produces a radially symmetrical radial variation of the obscuration. The radial thickness gradient requires is of the form $$t_r = t_c[1 - (r/r_o)^2]$$

where $r_o$ is the membrane radius. If a long evaporation distance is assumed so that the intrinsic radial thickness gradient is negligable, then the thickness ($t_r$) can be equated with the angular obscuration ($\theta_r$) of the shutter. The calculated values are as follows:

| $r/r_o$ | $t_r$ % | $\theta_r$ (X2π) |
|---|---|---|
| 0.0 | 100 | 0.00 |
| 0.1 | 99 | 0.01 |
| 0.2 | 96 | 0.04 |
| 0.3 | 91 | 0.09 |
| 0.4 | 84 | 0.16 |
| 0.5 | 75 | 0.25 |
| 0.6 | 64 | 0.36 |
| 0.7 | 51 | 0.49 |
| 0.8 | 36 | 0.64 |
| 0.9 | 19 | 0.81 |
| 1.0 | 0 | 1 |

The approximate shape of the shutter 36 is shown in FIG. 5.

Spinning:

A radial thickness gradient can be produced in a polymer film which is formed by spin casting, as illustrated in FIG. 6. FIG. 6 is an example of a radial gradient in a polymethylmethacrylate (PMMA) free standing pellicle. In this case a center to edge film thickness difference of about 1 μm is required because of the low x-ray absorption of the polymer.

It is more difficult to produce the required signature exactly using the spinning process, but approximation is satisfactory for most requirements. The transparency of the pellicle material permits more flexibility in location in this case.

It will thus be seen that the present invention does indeed provide a new and improved illumination system for x-ray lithography, which effectively meets the objects specified hereinbefore.

Although certain particular embodiments of the invention are herein disclosed for purposes of explanation, various modifications thereof, after study of this specification, will be apparent to those skilled in the art to which the invention pertains, and reference should accordingly be had to the appended claims in determining the scope the invention.

What is claimed is:

1. An X-Ray absorber for use in an X-Ray lithography system including an X-Ray radiation point source and a wafer comprising:
    an X-Ray transparent substrate; and
    X-Ray absorbent means, adjacent said substrate, for absorbing X-Ray radiation quadratically from maximum absorbtion at the center to minimum absorbtion at the edge thereof.

2. An X-Ray absorber as in claim 1 wherein said X-Ray absorbent means comprises:
an X-Ray absorbent material of quadratically decreasing axial thickness over the entire radial distance of said material from a maximum at the center to a minimum at the edge thereof.

3. An X-Ray lithography system comprising:
a point source of X-Ray radiation;
a wafer plane disposed in spaced relation to said point source of X-Ray radiation;
a mask disposed between said point source of X-Ray radiation and said wafer plane whereby X-Ray radiation from said point source of X-ray radiation passes through said mask to said wafer plane; and
X-Ray absorbent means mounted between said point source of X-Ray radiation and said wafer plane, said X-Ray absorbent means being of quadratically decreasing absorption from maximum absorption at the center to minimum absorption at the edge so as to have a radial absorption gradient profile to compensate for radial flux variation of the X-Ray radiation.

4. An X-Ray lithography system as in claim 3 further comprising:
means for permitting alignment illumination to reach said wafer plane.

5. An X-Ray lithography system as claimed in claim 3 wherein said X-Ray absorbent means is transparent to alignment radiation.

6. An X-Ray lithography system as claimed in claim 3 wherein said X-Ray absorbent means is movable to permit alignment illumination to reach said wafer plane.

7. An X-Ray lithography system as claimed in claim 3 wherein said X-Ray absorbent means is disposed on a pellicle which is movable.

8. An X-Ray lithography system as claimed in claim 3 wherein said X-Ray absorbent means comprises a film of polymethylmethacrylate.

9. An X-Ray lithography system as in claim 3 wherein said X-Ray absorbent means comprises:
an X-Ray absorbent material of quadratically decreasing axial thickness over the entire radial distance of said material from a maximum at the center to a minimum at the edge thereof.

10. A method of making an X-Ray absorber for use in X-Ray lithography comprising the steps of:
placing a substrate in the path of an evaporating source composed of X-Ray absorbing material;
rotating a shutter of predetermined shape between said substrate and said evaporating source; and
evaporating said evaporating source on said substrate while said shutter is rotating creating a quadratically radially decreasing thickness on said substrate.

* * * * *